United States Patent [19]

Chi et al.

[11] Patent Number: 5,761,126
[45] Date of Patent: Jun. 2, 1998

[54] SINGLE-POLY EPROM CELL THAT UTILIZES A REDUCED PROGRAMMING VOLTAGE TO PROGRAM THE CELL

[75] Inventors: Min-hwa Chi, Palo Alto; Chih Sieh Teng, San Jose; Albert Bergemont, Palo Alto, all of Calif.

[73] Assignee: National Semiconductor Corporation, Santa Clara, Calif.

[21] Appl. No.: 796,616

[22] Filed: Feb. 7, 1997

[51] Int. Cl.⁶ .................................................. G11C 11/34
[52] U.S. Cl. ................. 365/185.27; 365/185.01; 365/185.14; 257/314
[58] Field of Search .................. 365/185.27, 185.01, 365/185.14, 185.29; 257/314, 315

[56] References Cited

U.S. PATENT DOCUMENTS

| 5,280,446 | 1/1994 | Ma et al. ............................ 365/185.15 |
| 5,457,652 | 10/1995 | Brahmbhatt ....................... 365/185.06 |
| 5,491,657 | 2/1996 | Haddad et al. .................... 365/185.27 |
| 5,515,319 | 5/1996 | Smayling et al. ................. 365/185.27 |
| 5,612,913 | 3/1997 | Cappelletti et al. .............. 365/185.27 |

OTHER PUBLICATIONS

Ohnakado, T., et al., "Novel Electron Injection Method Using Band-to-Band Tunneling Induced Hot Electron (BBHE) for Flash Memory with a P-channel Cell." IEDM 1995, pp. 279-282.

Chan, T.Y. et al., "The Impact of Gate-Induced Drain Leakage Current on MOSFET Scaling." IEDM, 1987, 4 pages.

*Primary Examiner*—David C. Nelms
*Assistant Examiner*—Hoai Ho
*Attorney, Agent, or Firm*—Limbach & Limbach LLP

[57] ABSTRACT

The layout and the programming voltage of a single-poly EPROM cell are reduced by eliminating the n+ contact region which is conventionally utilized to place a positive voltage on the n-well of the cell, and by utilizing a negative voltage to program the cell. The negative voltage is applied to a p+ contact region formed in the n-well which injects electrons directly onto the floating gate of the cell.

19 Claims, 6 Drawing Sheets

5,761,126

SINGLE-POLY EPROM CELL THAT UTILIZES A REDUCED PROGRAMMING VOLTAGE TO PROGRAM THE CELL

BACKGROUND OF THE INVENTION

1. Field of the Invention

The present invention relates to a single-poly electrically-programmable read-only-memory (EPROM) cell and, more particularly, to a single-poly EPROM cell that utilizes a reduced programming voltage to program the cell.

2. Description of the Related Art

A single-poly electrically-programmable read-only-memory (EPROM) cell is a non-volatile storage device which is fabricated using process steps that are fully compatible with conventional single-poly CMOS fabrication process steps. As a result, single-poly EPROM cells are often embedded in CMOS logic and mixed-signal circuits.

FIGS. 1A–1C show a series of views that illustrate a conventional single-poly EPROM cell 100. FIG. 1A shows a plan view of cell 100, FIG. 1B shows a cross-sectional view taken along line 1B—1B of FIG. 1A, while FIG. 1C shows a cross-sectional view taken along line 1C—1C of FIG. 1A.

As shown in FIGS. 1A–1C, EPROM cell 100 includes spaced-apart source and drain regions 114 and 116, respectively, which are formed in a p-type semiconductor material 112, such as a well or a substrate, and a channel region 118 which is defined between source and drain regions 114 and 116.

As further shown in FIGS. 1A–1C, cell 100 also includes an n-well 120 which is formed in p-type material 112, and a field oxide region FOX which is formed in p-type material 112 to isolate source region 114, drain region 116, and channel region 118 from n-well 120.

In addition, cell 100 further includes adjoining p+ and n+ contact regions 122 and 124, respectively, which are formed in n-well 120. Current generation cells also include a p-type lightly-doped-drain (PLDD) region 126 which adjoins p+ contact region 122.

Further, a control gate region 128 is defined between PLDD region 126 and the field oxide region FOX that isolates n-well 120 from source region 114, drain region 116, and channel region 118. In addition, a layer of gate oxide 130 is formed over channel region 118, a layer of control gate oxide 132 is formed over control gate region 128, and a floating gate 134 is formed over gate oxide layer 130, control gate oxide layer 132, and a portion of the field oxide region FOX.

During the fabrication of cell 100, gate oxide layer 130 and control gate oxide layer 132 are typically grown at the same time and, as a result, have substantially the same thickness, e.g. approximately 120 Å for 0.5 micron technology, and 70 Å for 0.35 micron technology.

In operation, cell 100 is programmed by applying approximately 12 volts to contact regions 122 and 124, which are shorted together, and approximately 67 volts to drain region 116. In addition, both p-type material 112 and source region 114 are grounded.

When the positive voltage is applied to contacts 122 and 124, a positive potential is induced on floating gate 134. Specifically, the positive voltage applied to n+ contact region 124 in conjunction with the potential of floating gate 134 forms a deep depletion region at the surface of control gate region 128 which, in turn, reduces the potential at the surface of control gate region 128.

The positive voltage applied to p+ contact region 122 slightly forward-biases the p+ contact region to n-well junction at the surface. As a result, holes are injected into the surface region of control gate region 128, thereby inverting the surface of control gate region 128.

The injected holes quickly reduce the depth of the depletion region at the surface of control gate region 128 which, in turn, places substantially all of the voltage applied to contact region 124 across control gate oxide layer 132. As a result, the initial potential induced on floating gate 134 is defined by the voltage applied to contact regions 122 and 124, and the thickness of control gate oxide layer 132 (which defines the coupling ratio between n-well 120 and floating gate 134).

Without the presence of p+ contact region 122, few holes would accumulate at the surface of control gate region 128 when the surface is initially depleted because n-well 120 contains relatively few holes. Thus, the depth of the depletion region can only be slowly reduced in size as thermally-generated holes drift up to the surface of control gate region 128.

Since the depth of the depletion region is initially large, the initial potential induced on floating gate 134 is substantially less because the voltage applied to contact 124 is placed across both control gate oxide layer 132 and a relatively large depletion region. Thus, p+ region 122 provides a method for quickly reducing the depth of the depletion region after the surface of control gate region 128 is depleted which, in turn, increases the potential initially induced on floating gate 134.

As noted above, current generation cells also require the use of PLDD region 126. As is well known, the thickness of control gate oxide layer 132 at the edge of the layer which is adjacent to p+ contact region 122 is slightly thicker than the central portion of the layer. As a result, the depletion region formed at the edge is too small to sufficiently invert the surface which, in turn, limits the ability of p+ contact region 122 to inject holes into the surface of control gate region 128.

Thus, current generation cells utilize PLDD region 126 to form a hole injection region that adjoins the surface region of control gate region 128 away from the edge. Previous generation cells did not require a PLDD region because the thermal steps used during the fabrication of these cells allowed sufficient lateral diffusion of p+ contact region 122.

Returning again to the operation of cell 100, the positive potential induced on floating gate 134 from the application of a positive voltage to contact regions 122 and 124 forms a depletion region in channel region 118 which increases the potential at the surface of channel region 118. Source region 114 then injects electrons into the surface of channel region 118 which, in turn, forms a channel of mobile electrons.

The positive voltage applied to drain region 116 sets up an electric field between source and drain regions 114 and 116 which then accelerates the electrons in the channel. The accelerated electrons then have ionizing collisions that form "channel hot electrons". The positive potential of floating gate 134 attracts these channel hot electrons which penetrate gate oxide layer 130 and begin accumulating on floating gate 134, thereby raising the threshold voltage of cell 100.

Cell 100 is read by applying approximately 5 volts to contact regions 122 and 124, and approximately 1–2 volts to drain region 116. In addition, both p-type material 112 and source region 114 are grounded.

Under these bias conditions, a positive potential is induced on floating gate 134 by the above-described mechanism which is sufficient, i.e., larger than the threshold voltage of the cell, to create a channel current that flows from drain region 116 to source region 114 if cell 100 has not been programmed, and insufficient, i.e., less than the threshold voltage of the cell, to create the channel current if cell 100 has been programmed. The logic state of cell 100 is then determined by comparing the magnitude of the channel current flowing into drain region 116 with a reference current.

EPROM cell 100 is erased by irradiating cell 100 with ultraviolet (UV) light to remove the electrons. The UV light increases the energy of the electrons which, in turn, allows the electrons to penetrate the surrounding layers of oxide.

One problem with single-poly EPROM cells that are embedded in CMOS logic and mixed-signal circuits is that the cells are not well suited for low-power applications. Thus, when the underlying circuitry is scaled down for low-power applications, single-poly EPROM cells still require high-voltage circuitry to provide the needed programming voltages.

In addition, the formation of channel hot electrons during the programming of a conventional single-poly EPROM cell draws a relatively large current for low-power applications. Thus, there is a need for a single-poly EPROM cell that operates in a low-voltage environment.

SUMMARY OF THE INVENTION

Conventional single-poly EPROM cells utilize a well region as the control gate of the cell, and further utilize adjoining n+ and p+ contact regions, which are formed in the well region, as a means for biasing the well region and injecting minority carriers into the surface of the well region during programming. The present invention reduces the size of a single-poly EPROM cell by eliminating one of the contact regions.

In addition, conventional single-poly EPROM cells are programmed by applying a large positive voltage to the n+ and p+ regions. The present invention substantially reduces the magnitude of the voltage utilized during programming by applying a smaller negative voltage to the contact region which, in turn, causes carriers to be injected onto the floating gate of the cell.

The single-poly EPROM cell of the present invention, which is formed in a semiconductor material of a first conductivity type, includes spaced-apart source and drain regions of a second conductivity type which are formed in the semiconductor material, and a channel region which is defined between the source and drain regions.

In addition, the cell of the present invention also includes a well region of the second conductivity type which is formed in the semiconductor material, an isolation region which is formed in the semiconductor material to isolate the source region, the drain region, and the channel region from the well region, and a single contact region which is formed in the well region.

Further, a lightly-doped region of the first conductivity type is formed in the semiconductor material to adjoin the contact region, while a control gate region is defined between the lightly-doped region the isolation region. The cell of the present invention additionally includes a layer of gate oxide formed over the channel region, a layer of tunnel oxide formed over the control gate region, and a floating gate formed over the gate oxide layer, the tunnel oxide layer, and a portion of the isolation region.

The cell of the present invention is programmed by applying a negative voltage to the single contact region, and grounding the semiconductor material. In addition, the source and drain regions are grounded or floated.

In a first alternate embodiment, both n+ and p+ contact regions are formed in the well region. However, unlike conventional single-poly EPROM cells, the n+ and p+ regions are spaced apart.

The memory cell of the first alternate embodiment, which is formed in a semiconductor material of a first conductivity type, includes spaced-apart source and drain regions of a second conductivity type which are formed in the semiconductor material, and a channel region which is defined between the source and drain regions.

In addition, the cell of the first alternate embodiment also includes a well region of the second conductivity type which is formed in the semiconductor material, an isolation region which is formed in the semiconductor material to isolate the source region, the drain region, and the channel region from the well region, a first contact region of the first conductivity type formed in the well region, and a second contact region of the second conductivity type formed in the well region. In accordance with the first alternate embodiment, the first and second contact regions are spaced apart.

Further, a lightly-doped region of the first conductivity type is formed in the semiconductor material to adjoin the first contact region, while a control gate region is defined between the lightly-doped region the isolation region. The cell of the first alternate embodiment additionally includes a layer of gate oxide formed over the channel region, a layer of tunnel oxide formed over the control gate region, and a floating gate formed over the gate oxide layer, the tunnel oxide layer, and a portion of the isolation region.

The cell of the first alternate embodiment is programmed by applying a negative voltage to the first contact region, grounding the semiconductor material, and applying a contact voltage, such as a positive voltage, to the second contact region. In addition, the source and drain regions are grounded or floated.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 1A is a plan view of cell 100, FIG. 1B is a cross-sectional view taken along line 1B—1B of FIG. 1A, and FIG. 1C is a cross-sectional view taken along line 1C—1C of FIG. 1A.

FIG. 2A is a plan view of cell 200, FIG. 2B is a cross-sectional view taken along V line 2B—2B of FIG. 2A, and FIG. 2C is a cross-sectional view taken along line 2C—2C of FIG. 2A.

FIG. 3A is a plan view of cell 300, FIG. 3B is a crosssectional view taken along line 3B—3B of FIG. 3A, FIG. 3C is a cross-sectional view taken along line 3C—3C of FIG. 3A, and FIG. 3D is a cross-sectional view taken along line 3D—3D of FIG. 3A.

FIG. 4A is a plan view of cell 400, FIG. 4B is a cross-sectional view taken along line 4B—4B of FIG. 4A, and FIG. 4C is a cross-sectional view taken along line 4C—4C of FIG. 4A.

FIG. 5A is a plan view of cell 500. FIG. 5B is a cross-sectional view taken along line 5B—5B of FIG. 5A. FIG. 5C is a cross-sectional view taken along line 5C—5C of FIG. 5A, and FIG. 5D is a cross-sectional view taken along line 5D—5D of FIG. 5A.

DETAILED DESCRIPTION

Figure 2A:
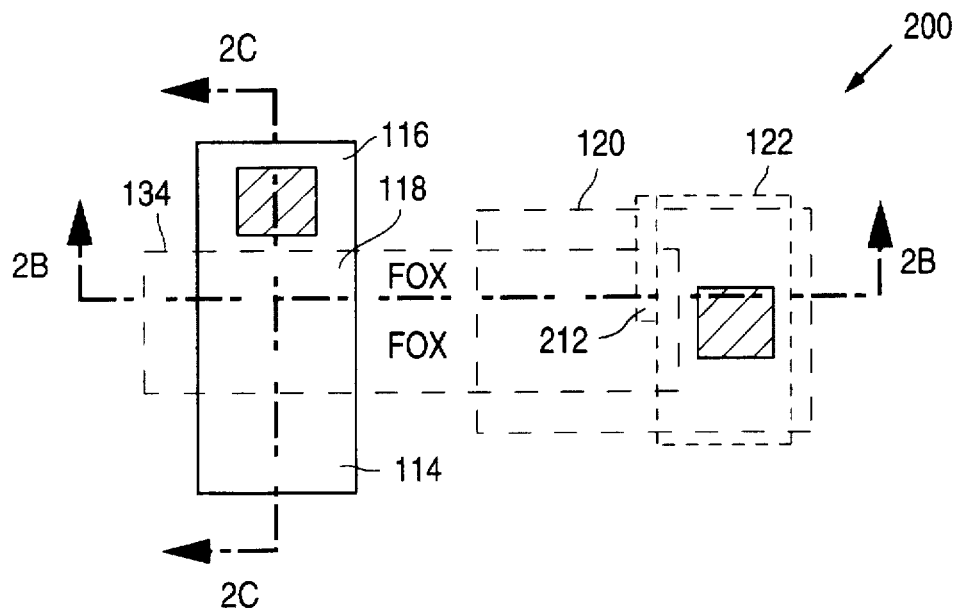
FIGS. 2A–2C are a series of views illustrating a single-poly EPROM cell 200 in accordance with the present invention.
Figure 2B:
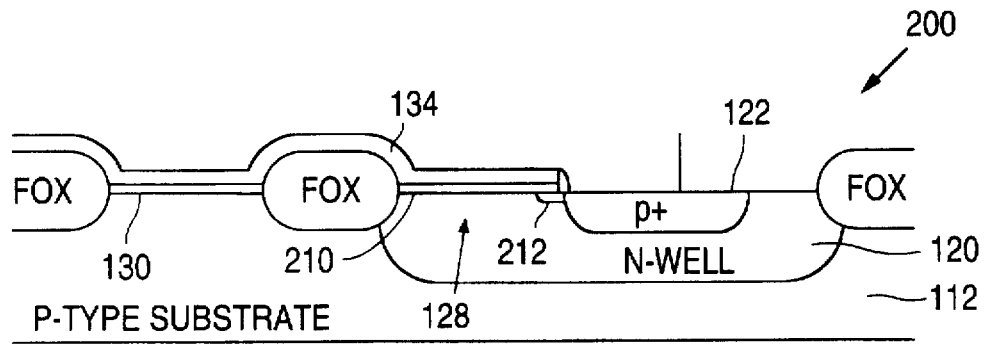
Figure 2C:
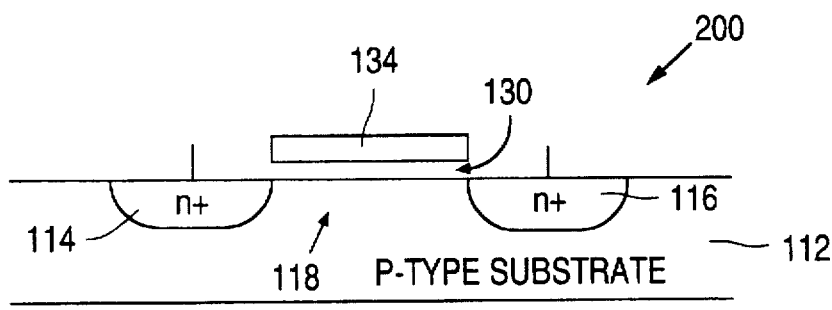

FIGS. 2A-2C show a series of views that illustrate a single-poly EPROM cell 200 in accordance with the present invention. FIG. 2A shows a plan view of cell 200, FIG. 2B shows a cross-sectional view taken along line 2B—2B of FIG. 2A, while FIG. 2C shows a cross-sectional view taken along line 2C—2C of FIG. 2A.

As shown in FIGS. 2A-2C, EPROM cell 200 is structurally similar to EPROM cell 100 of FIG. 1 and, as a result, utilizes the same reference numerals to designate the structures which are common to both cells.

EPROM cell 200 principally differs from EPROM cell 100 in that EPROM cell 200 eliminates the need for n+ contact region 124. In addition, cell 200 also differs from cell 100 in that cell 200 utilizes a smaller PLDD region 212. As shown in FIG. 2A, the surface of p+ contact region 122 contacts both the surface of PLDD region 212 and the surface of n-well 120.

Further, cell 200 additionally utilizes a substantially thinner layer of tunnel oxide 210, e.g. approximately 70 Å thick in 0.5 micron technology and 55 Å thick in 0.35 micron technology, in lieu of the thicker layer of control gate oxide 132 utilized by cell 100, e.g., 120 Å and 70 Å thick, respectively. Alternately, oxide layers 132 and 210 can be formed to have substantially the same thickness.

As a result of utilizing a relatively thin layer of tunnel oxide, cell 200 provides an n-well to floating gate coupling ratio of approximately 0.8. In addition, due to the positioning of p+ contact region 122 with respect to floating gate 134, cell 200 also provides a very low p+ junction edge to floating gate coupling ratio of less than 0.05.

In operation, cell 200 is programmed by applying approximately −6 to −7 volts to p+ contact region 122, and grounding p-type material 112. In addition, both source and drain regions 114 and 116 are grounded or floated.

As a result, the potential of n-well 120 is clamped to approximately −0.5 volts which, in turn, slightly forward biases the p-type material 112 to n-well 120 junction, and reverse biases the n-well to p+ contact junction. (Although p+ contact region 122, n-well 120, and p-type material 112 form a parasitic bipolar transistor, the bipolar action is weak due to the low doping of p-type material 112). Further, since n-well 120 is near ground and the n-well to floating gate coupling ratio is approximately 0.8, the voltage on floating gate 134 is also close to ground.

Under these bias conditions, the vertical electric field across tunnel oxide layer 210 causes a depletion region to be formed in p+ contact region 122 and PLDD region 212 which, in turn, increases the potential at the surface of p+ contact region 122 and PLDD region 212.

In addition, the vertical electric field is also large enough to trigger band-to-band tunneling of electrons, which tunnel from the valence band to the conduction band, in p+ contact region 122 which then accumulate on the surface of p+ region 122. Although significant band-to-band tunneling does not occur in PLDD region 212, thermally-generated electrons accumulate on the surface of PLDD region 212.

The band-to-band electrons then drift into the depletion region of the reverse-biased n-well to p+ contact junction where the lateral electric field across the depletion region accelerates the electrons into having ionizing collisions that form band-toband hot electrons.

In addition, thermally-generated electrons in the depletion region are also accelerated by the lateral electric field into having ionizing collisions that form thermal hot electrons. Both the band-to-band and thermal hot electrons initiate the avalanche process which produces many more hot electrons. The more positive potential of floating gate 134 attracts these hot electrons which penetrate tunnel oxide layer 210 and begin accumulating on floating gate 134.

Thus, by forming PLDD region 212 so that the surface of p+ contact region 122 contacts both the surface of PLDD region 212 and n-well 120, the band-to-band and thermal hot electrons are formed at the surface of control gate region 128 where tunneling is most likely to occur.

Alternately, PLDD region 212 can be formed so that the surface of p+ contact region 122 closest to control gate region 128 does not contact the surface of n-well 120. In this case, however, a lower injection efficiency is obtained because of the lower lateral electric field associated with the PLDD to n-well junction. In addition, hot electrons which are formed below the PLDD region at the p+ contact to n-well junction must pass through the PLDD region to penetrate tunnel oxide layer 210.

In addition to the formation of hot electrons, the band-to-band electrons at the surface of p+ contact region 122 and the thermally-generated electrons at the surface of PLDD region 212 are also injected onto floating gate 134 by means of Fowler-Nordheim tunneling.

For example, when −7 volts is applied to p+ contact region 122, the electric field across oxide layer 210 over PLDD region 212 is approximately 10.0 MV/cm. Slightly smaller electric fields are set up over p+ contact region 122. Higher oxide fields can be obtained by increasing the voltage applied to p+ contact region 122, or by reducing the thickness of tunnel oxide layer 210.

Cell 200 is read by applying approximately 5 volts to p+ contact region 122, and approximately 1-2 volts to drain region 116. In addition, both p-type material 112 and source region 114 are grounded.

When the positive voltage is applied to p+ contact region 122, a positive potential is induced on floating gate 134. Specifically, the positive voltage applied to p+ contact region 122 clamps the potential of n-well 120 to the voltage applied to p+ contact region 122 which, in conjunction with the potential of floating gate 134, forms a depletion region at the surface of control gate region 128 which reduces the potential at the surface of control gate region 128.

The positive voltage applied to p+ contact region 122 slightly forward-biases the PLDD region to n-well junction at the surface which, in turn, causes holes to be injected into the surface region of control gate region 128.

As with cell 100, the injected holes quickly reduce the depth of the depletion region at the surface of control gate region 128 which, in turn, places substantially all of the voltage applied to contact region 122 across tunnel oxide layer 210. Thus, the principal function of PLDD region 212 is as a source of holes when cell 200 is read.

Thus, when a read voltage is applied to p+ contact region 122, a positive potential is induced on floating gate 134 by the above-described mechanism which is sufficient to create a channel current that flows from drain region 116 to source region 114 if cell 200 has not been programmed, and insufficient to create the channel current if cell 200 has been programmed.

The logic state of cell 200 is then determined by comparing the magnitude of the current flowing into drain region 116 with a reference current. There will, however, be a somewhat larger leakage current in cell 200 at the p+ contact to n-well junction flowing from p+ contact region 122 to p-type material 112 due to the bipolar action of the parasitic bipolar transistor, i.e., p+ contact region 122, n-well 120, and p-type material 112 as emitter, base, and collector, respectively.

Thus, a single-poly EPROM cell has been disclosed which can be programmed with voltages that are approximately one-half the voltages required by conventional single-poly EPROM cells, e.g., 12 volts versus −6 to −7 volts.

One of the principal advantages of the present invention is that band-to-band hot electron injection is approximately 100 times more efficient than the channel hot electron programming conventionally used to program single-poly EPROM cells. In addition, by eliminating the n+ contact used in conventional single-poly EPROM cells, a substantially smaller cell layout is obtained.

Figure 3A:
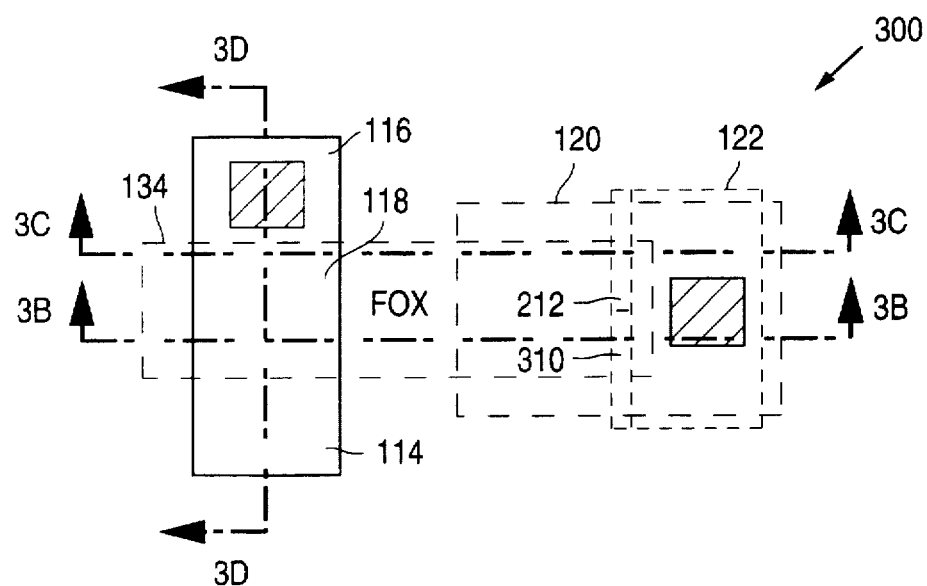
FIGS. 3A–3D are a series of views illustrating a single-poly EPROM cell 300 in accordance with a first alternate embodiment of the present invention.
Figure 3B:
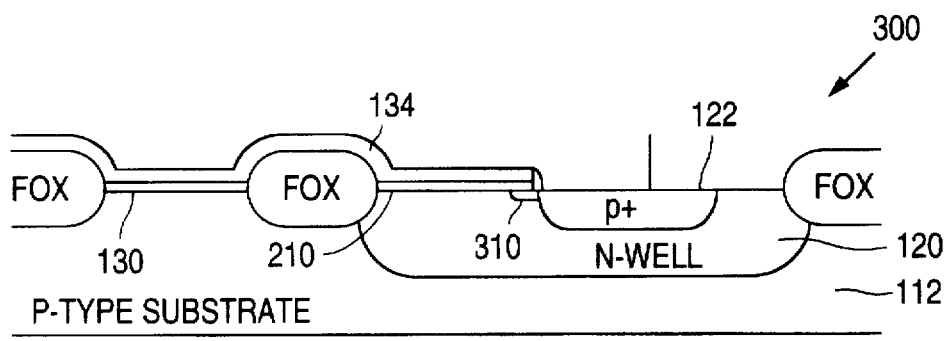
Figure 3C:
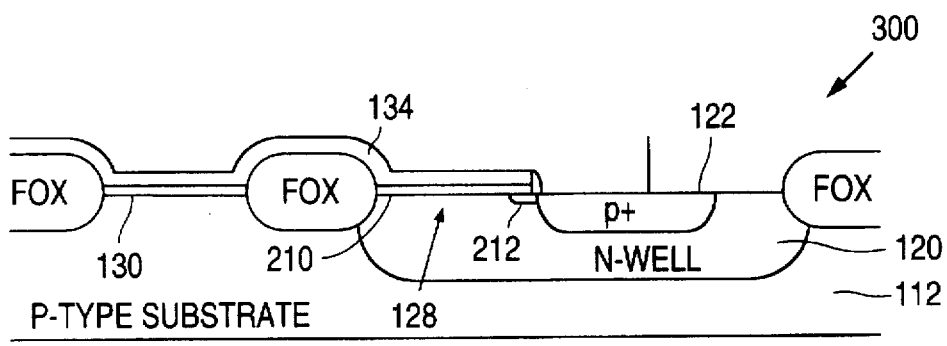
Figure 3D:
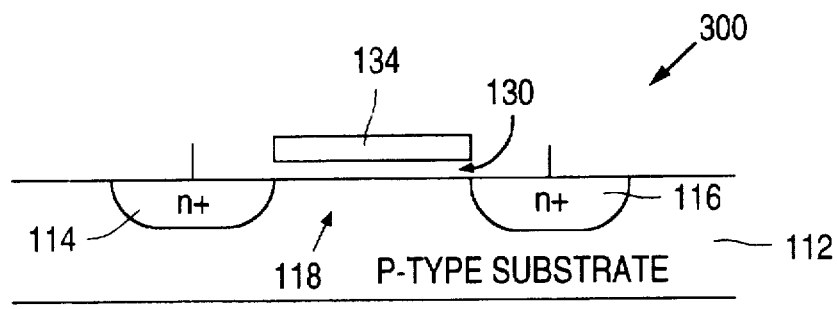

FIGS. 3A–3D show a series of views that illustrate a single-poly EPROM cell 300 in accordance with a first alternate embodiment of the present invention. FIG. 3A shows a plan view of cell 300, FIG. 3B shows a cross-sectional view taken along line 3B—3B of FIG. 3A, FIG. 3C shows a cross-sectional view taken along line 3C—3C of FIG. 3A, and FIG. 3D shows a cross-sectional view taken along line 3D—3D of FIG. 3A.

As shown in FIGS. 3A–3D, EPROM cell 300 is structurally similar to EPROM cell 200 of FIGS. 2A–2C and, as a result, utilizes the same reference numerals to designate the structures which are common to both cells. EPROM cell 300 principally differs from EPROM cell 200 in that EPROM cell 300 also utilizes an NLDD region 310.

The operation of cell 300 is the same as the operation of cell 200 except that NLDD region 310 enhances the formation of hot electrons due to the larger lateral electric field that exists across the depletion region of the p+ contact to NLDD junction. As a result of the larger lateral electric field, cell 300 produces substantially more band-to-band and thermal hot electrons than does cell 200.

Figure 4A:
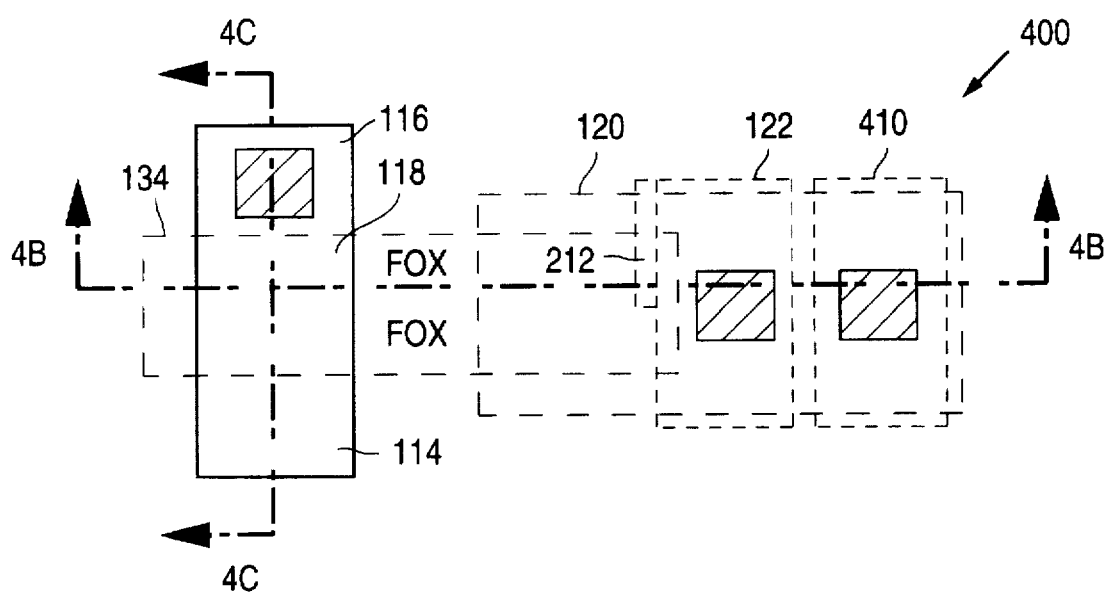
FIGS. 4A–4C are a series of views illustrating a single-poly EPROM cell 400 in accordance with a second alternate embodiment of the present invention.
Figure 4B:
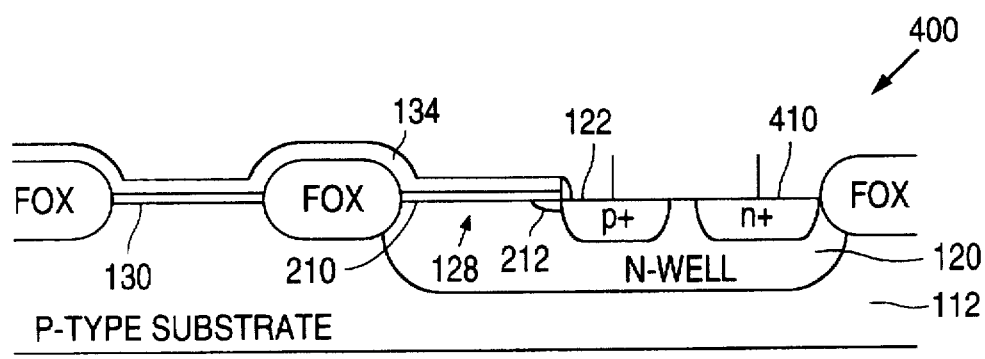
Figure 4C:
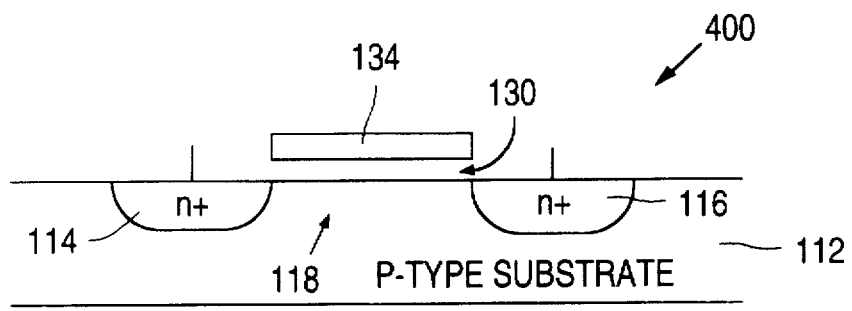

FIGS. 4A–4C show a series of views that illustrate a single-poly EPROM cell 400 in accordance with a second alternate embodiment of the present invention. FIG. 4A shows a plan view of cell 400, FIG. 4B shows a cross-sectional view taken along line 4B—4B of FIG. 4A, while FIG. 4C shows a cross-sectional view taken along line 4C—4C of FIG. 4A.

As shown in FIGS. 4A–4C, EPROM cell 400 is structurally similar to EPROM cell 200 of FIGS. 2A–2C and, as a result, utilizes the same reference numerals to designate the structures which are common to both cells. EPROM cell 400 principally differs from EPROM cell 200 in that EPROM cell 400 also utilizes an n+ contact region 410 which, unlike conventional cells, is spaced apart from p+ contact region 122.

In operation, cell 400 is programmed by applying approximately −4 volts to p+ contact region 122, grounding p-type material 112, and applying approximately +4 volts to n+ contact region 410. In addition, both source and drain regions 114 and 116 are grounded or floated.

As a result, the voltage applied n+ contact region 410 is placed on n-well 120 which reverse-biases both the p-type material 112 to n-well 120 junction, and the n-well to p+ contact junction. Thus, cell 400 eliminates the parasitic bipolar transistor that existed within cells 200 and 300.

Further, since the potential on n-well 120 is approximately +4 volts and the n-well to floating gate coupling ratio is approximately 0.8, the potential on floating gate 134 is also close to +4 volts. Thus, substantially the same vertical electric field is formed in cell 400 by placing +4 volts on n+ contact region 410 and −4 volts on p+ contact region 122 as is formed in cell 200 by placing −6 to −7 volts on only p+ contact region 122.

Thus, the vertical electric field across tunnel oxide layer 210 of cell 400 also causes a depletion region to be formed in p+ contact region 122 and PLDD region 212 which increases the potential at the surfaces of p+ contact region 122 and PLDD region 212.

In addition, the vertical electric field is also large enough to trigger band-to-band tunneling of electrons in p+ contact region 122 of cell 400 which then accumulate on the surface of p+ region 122. As with cell 200, significant band-to-band tunneling does not occur in PLDD region 212, although thermally-generated electrons accumulate on the surface of PLDD region 212.

One significant difference between cell 400 and cell 200, however, is that cell 400 provides a substantially larger reverse bias across the p+ contact region to n-well junction.

Thus, when the band-to-band electrons drift into the depletion region of the reverse-biased n-well to p+ contact junction, the stronger lateral electric field of cell 400 accelerates the electrons into having more ionizing collisions that form more band-to-band hot electrons.

In addition, thermally-generated electrons in the depletion region of the reverse-biased n-well to p+ contact junction are also accelerated by the stronger lateral electric field into having more ionizing collisions that form more thermal hot electrons. Both the band-to-band and thermal hot electrons initiate the avalanche process which produces many more hot electrons. As with cell 200, the more positive potential of floating gate 134 attracts these band-to-band and thermal hot electrons which penetrate tunnel oxide layer 210 and begin accumulating on floating gate 134.

Further, as with cell 200, the band-to-band electrons at the surface of p+ contact region 122 and the thermally-generated electrons at the surface of PLDD region 212 are also injected onto floating gate 134 by means of Fowler-Nordheim tunneling.

Figure 1A:
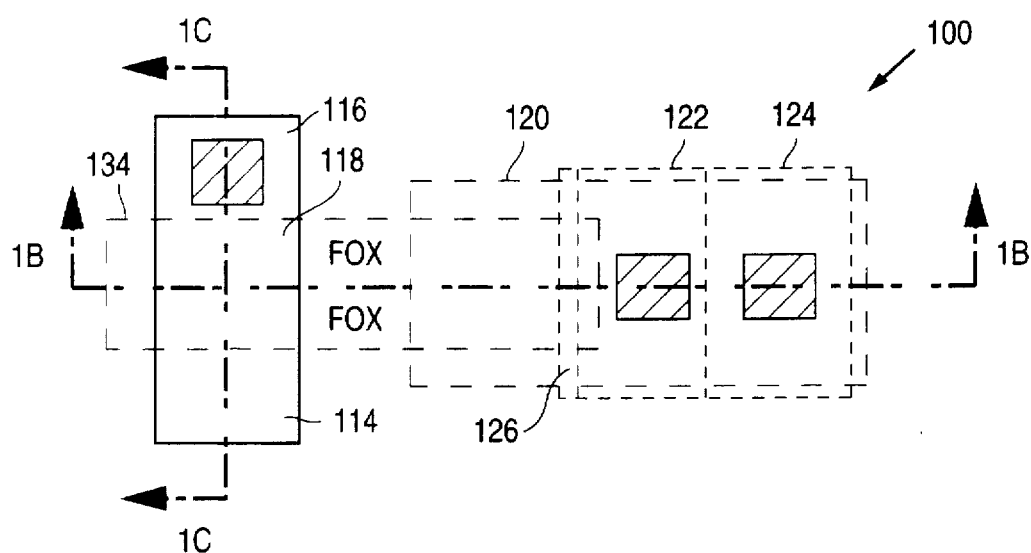
FIGS. 1A–1C are a series of views illustrating a conventional single-poly EPROM cell 100.
Figure 1B:
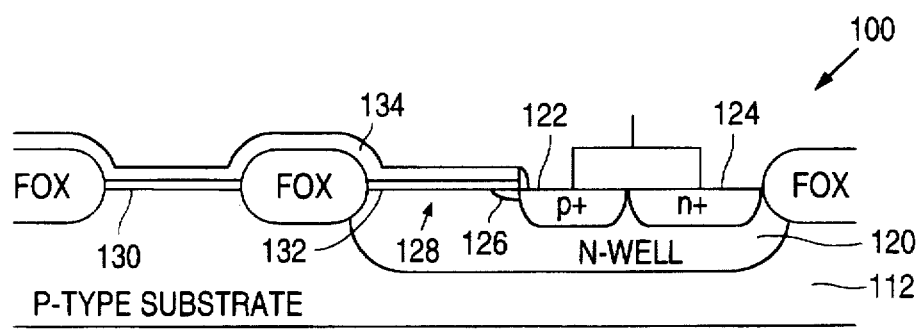
Figure 1C:
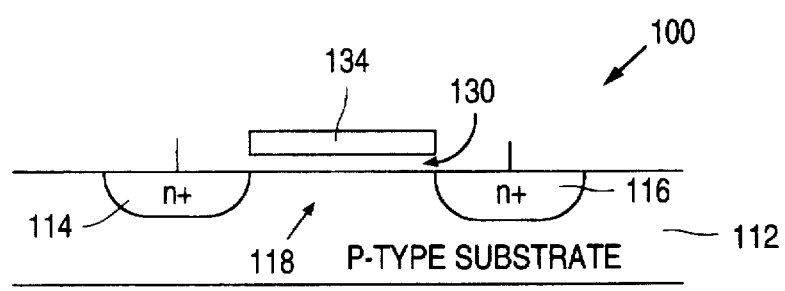

Cell 400 is read the same way as cell 100 of FIGS. 1A–1C or, alternately, can be read the same way that cell 200 of FIGS. 2A–2C is read. Thus, cell 400 can be read by placing the same voltage on p+ contact region 122 and n+ contact region 410, e.g., 5 volts, or by placing a positive voltage on p+ contact region 122, e.g., 5 volts, and floating n+ contact region 410 (while placing a positive voltage on drain region 116, e.g., 1 volt, and ground source region 114).

Figure 5A:
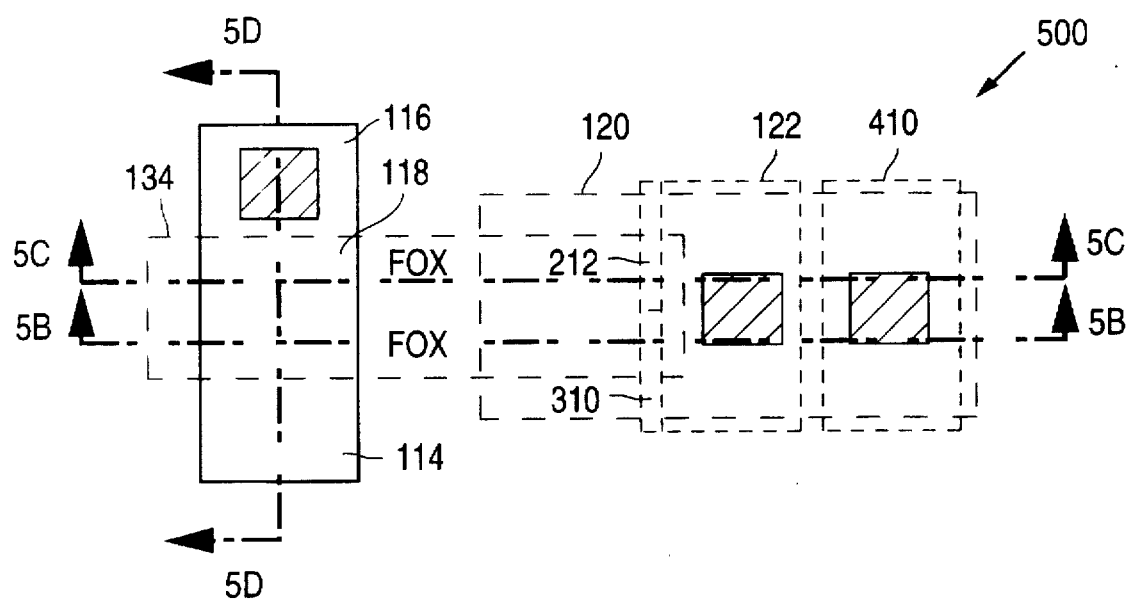
FIGS. 5A–5D are a series of views illustrating a single-poly EPROM cell 500 in accordance with a third alternate embodiment of the present invention.
Figure 5B:
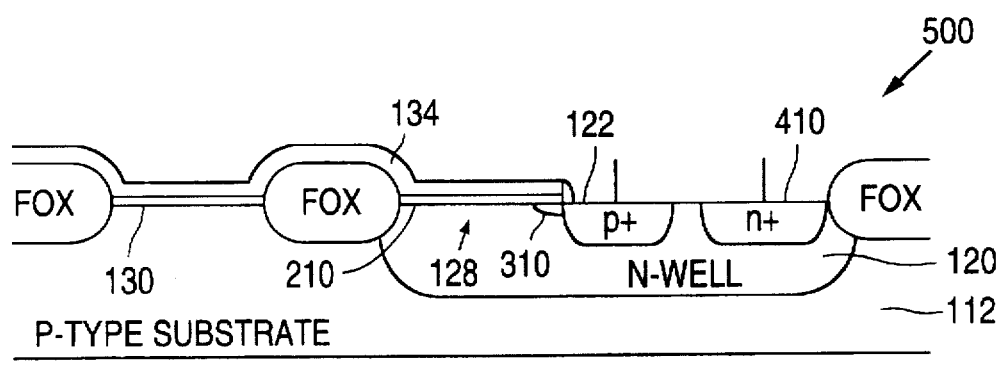
Figure 5C:
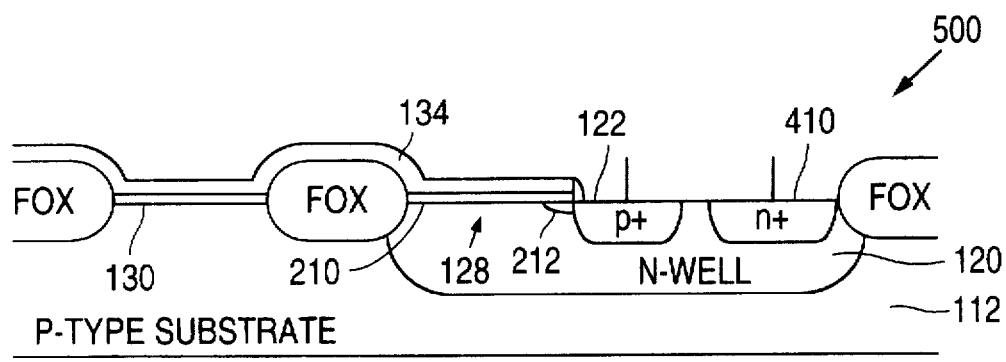
Figure 5D:
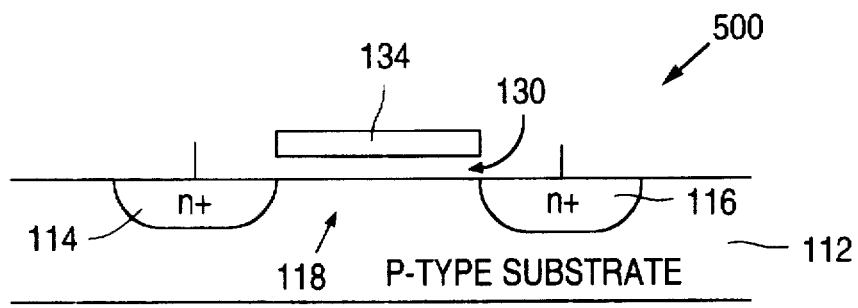

FIGS. 5A–5D show a series of views that illustrate a single-poly EPROM cell 500 in accordance with a third alternate embodiment of the present invention. FIG. 5A shows a plan view of cell 500, FIG. 5B shows a cross-sectional view taken along line 5B—5B of FIG. 5A, FIG. 5C shows a cross-sectional view taken along line 5C—5C of FIG. 5A, while FIG. 5D shows a cross-sectional view taken along line 5D—5D of FIG. 5A.

As shown in FIGS. 5A–5D, EPROM cell 500 is structurally similar to EPROM cell 400 of FIGS. 4A–4C and, as a result, utilizes the same reference numerals to designate the structures which are common to both cells. EPROM cell 500 principally differs from EPROM cell 400 in that EPROM cell 500 also utilizes an NLDD region 510.

The operation of cell 500 is the same as the operation of cell 400 except that NLDD region 510 enhances the formation of hot electrons by further increasing the lateral electric field that exists across the depletion region of the p+ contact to NLDD junction.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A memory cell formed in a semiconductor material of a first conductivity type, the memory cell comprising:

a source region of a second conductivity type formed in the semiconductor material;

a drain region of the second conductivity type formed in the semiconductor material;

a channel region defined between the source and drain regions;

a well region of the second conductivity type formed in the semiconductor material, the well region having a surface;

an isolation region formed in the semiconductor material to isolate the source region, the drain region, and the channel region from the well region;

a contact region formed in the well region, the well region having only one contact region formed therein, the contact region having a surface and the first conductivity type;

a lightly-doped region of the first conductivity type formed in the semiconductor material to adjoin the contact region so that the surface of the contact region adjoins the surface of the well region and a surface of the lightly-doped region;

a control gate region defined between the lightly-doped region the isolation region;

a layer of gate oxide formed over the channel region, the layer of gate oxide having a thickness;

a layer of tunnel oxide formed over the control gate region, the layer of tunnel oxide having a thickness; and a floating gate formed over the gate oxide layer, the tunnel oxide layer, and a portion of the isolation region.

2. The memory cell of claim 1 wherein the thickness of the tunnel oxide layer is substantially thinner than the thickness of the gate oxide layer.

3. The memory cell of claim 1 and further comprising a lightly-doped region of the second conductivity type formed to adjoin the contact region.

4. The memory cell of claim 1 wherein the isolation region comprises a field oxide region.

5. A method for programming a memory cell formed in a semiconductor material of a first conductivity type, the memory cell comprising:

a source region of a second conductivity type formed in the semiconductor material;

a drain region of the second conductivity type formed in the semiconductor material;

a channel region defined between the source and drain regions;

a well region of the second conductivity type formed in the semiconductor material, the well region having a surface;

an isolation region formed in the semiconductor material to isolate the source region, the drain region, and the channel region from the well region;

a contact region formed in the well region, the contact region having a surface;

a lightly-doped region of the first conductivity type formed in the semiconductor material to adjoin the contact region so that the surface of the contact region adjoins the surface of the well region and a surface of the lightly-doped region;

a control gate region defined between the lightly-doped region the field oxide region that isolates the well region from the source region, the drain region, and the channel region;

a layer of gate oxide formed over the channel region;

a layer of tunnel oxide formed over the control gate region; and a floating gate formed over the gate oxide layer, the tunnel oxide layer, and a portion of the field oxide region, the method comprising the step of applying programming biasing voltages by:

applying a negative voltage to the contact region; and grounding the semiconductor material, the programming biasing voltages causing electrons to accumulate on the floating gate.

6. The method of claim 5 and further comprising the step of grounding the source and drain regions.

7. The method of claim 5 and further comprising the step of floating the source and drain regions.

8. A memory cell formed in a semiconductor material of a first conductivity type, the memory cell comprising:

a source region of a second conductivity type formed in the semiconductor material;

a drain region of the second conductivity type formed in the semiconductor material; a channel region defined between the source and drain regions;

a well region of the second conductivity type formed in the semiconductor material, the well region having a surface;

an isolation region formed in the semiconductor material to isolate the source region, the drain region, and the channel region from the well region;

a first contact region of the first conductivity type formed in the well region, the first contact region having a surface;

a second contact region of the second conductivity type formed in the well region, the second contact region being spaced apart from the first contact region;

a lightly-doped region of the first conductivity type formed to adjoin the first contact region so that the surface of the first contact region adjoins the surface of the well region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region.

9. The memory cell of claim 8 and further comprising a lightly-doped region of the second conductivity type formed to adjoin the first contact region.

10. The memory cell of claim 8 wherein the isolation region comprises a field oxide region.

11. A method for programming a memory cell formed in a semiconductor material of a first conductivity type, the memory cell comprising:

a source region of a second conductivity type formed in the semiconductor material;

a drain region of the second conductivity type formed in the semiconductor material;

a channel region defined between the source and drain regions;

a well region of the second conductivity type formed in the semiconductor material, the well region having a surface;

an isolation region formed in the semiconductor material to isolate the source region, the drain region, and the channel region from the well region;

a first contact region of the first conductivity type formed in the well region, the first contact region having a surface;

a second contact region of the second conductivity type formed in the well region, the second contact region being spaced apart from the first contact region;

a lightly-doped region of the first conductivity type formed to adjoin the first contact region so that the surface of the first contact region adjoins the surface of the well region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying programming biasing voltages by:

applying a first voltage to the first contact region, the first voltage being negative;

applying a second voltage to the second contact region, the second voltage being more positive than the first voltage; and grounding the semiconductor material, the programming biasing voltages causing electrons to accumulate on the floating gate.

12. The method of claim 11 and further comprising the step of grounding the source and drain regions.

13. The method of claim 11 and further comprising the step of floating the source and drain regions.

14. The method of claim 11 wherein the second voltage is positive.

15. A method for reading a memory cell formed in a semiconductor material of a first conductivity type, the memory cell comprising:

a source region of a second conductivity type formed in the semiconductor material;

a drain region of the second conductivity type formed in the semiconductor material;

a channel region defined between the source and drain regions;

a well region of the second conductivity type formed in the semiconductor material, the well region having a surface;

an isolation region formed in the semiconductor material to isolate the source region, the drain region, and the channel region from the well region;

a contact region formed in the well region, the well region having only one contact region formed therein, the contact region having a surface and the first conductivity type;

a lightly-doped region of the first conductivity type formed to adjoin the contact region so that the surface of the contact region adjoins the surface of the well region and a surface of the lightly-doped region;

a control gate region defined between the lightly-doped region the field oxide region that isolates the well region from the source region, the drain region, and the channel region;

a layer of gate oxide formed over the channel region;

a layer of tunnel oxide formed over the control gate region; and a floating gate formed over the gate oxide layer, the tunnel oxide layer, and a portion of the field oxide region, the method comprising the steps of:

applying a first positive voltage to the single contact region;

grounding the source region;

applying a second positive voltage to the drain region; and grounding the semiconductor material.

16. The method of claim 15 wherein the second positive voltage is less than the first positive voltage.

17. A method for reading a memory cell formed in a semiconductor material of a first conductivity type, the memory cell comprising:

a source region of a second conductivity type formed in the semiconductor material;

a drain region of the second conductivity type formed in the semiconductor material;

a channel region defined between the source and drain regions;

a well region of the second conductivity type formed in the semiconductor material, the well region having a surface;

an isolation region formed in the semiconductor material to isolate the source region, the drain region, and the channel region from the well region;

a first contact region of the first conductivity type formed in the well region, the first contact region having a surface;

a second contact region of the second conductivity type formed in the well region, the second contact region being spaced apart from the first contact region;

a lightly-doped region of the first conductivity type formed to adjoin the first contact region so that the surface of the first contact region adjoins the surface of the well region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the steps of:

applying a first voltage to the first contact region;

applying a second voltage to the source region;

applying a third voltage to the drain region; and grounding the semiconductor material.

18. The method of claim 17 wherein the second contact region is floated.

19. The method of claim 17 wherein the first voltage is applied to the second contact region.

* * * * *

UNITED STATES PATENT AND TRADEMARK OFFICE
CERTIFICATE OF CORRECTION

PATENT NO.: 5,761,126
DATED: June 2, 1998
INVENTOR(S): Min-hwa Chi et al.

It is certified that error appears in the above-identified patent and that said Letters Patent is hereby corrected as shown below:

In Col. 10, line 8, delete "applving" and replace with --applying--.

Signed and Sealed this

Eighteenth Day of August, 1998

Attest:

BRUCE LEHMAN

Attesting Officer      Commissioner of Patents and Trademarks